US005930589A

United States Patent [19]

Hilgers et al.

[11] Patent Number: 5,930,589

[45] Date of Patent: Jul. 27, 1999

[54] METHOD FOR FABRICATING AN INTEGRATED FIELD EMISSION DEVICE

[75] Inventors: Kevin B. Hilgers, Phoenix; Bruce G. Smith, Tempe, both of Ariz.

[73] Assignee: Motorola, Inc., Schaumburg, Ill.

[21] Appl. No.: 08/810,312

[22] Filed: Feb. 28, 1997

[51] Int. Cl.[6] .......... H01L 21/00

[52] U.S. Cl. .......... 438/20; 438/28

[58] Field of Search .......... 438/20, 22, 28, 438/679; 445/24; 216/11

[56] References Cited

U.S. PATENT DOCUMENTS

| | | | |
|---|---|---|---|
| 5,316,511 | 5/1994 | Lee | 445/24 |
| 5,382,867 | 1/1995 | Maruo et al. | 313/309 |
| 5,401,676 | 3/1995 | Lee | 438/20 |
| 5,735,721 | 4/1998 | Choi | 445/24 |

*Primary Examiner*—Tuan H. Nguyen

*Attorney, Agent, or Firm*—S. Kevin Pickens; Jasper W. Dockrey

[57] ABSTRACT

A method for fabricating an integrated field emission device (90) includes the steps of: (1) providing a substrate (52), (2) forming a conductive layer (54) on the substrate (52), (3) depositing a dielectric layer (56) on the conductive layer (54), (4) forming an emission well (62) in the dielectric layer (56), (5) forming an emissive film (72) over the dielectric layer (56) so that the emissive film (72) extends partially into the emission well (62) to define an emissive edge (94) within the emission well (62), and (6) selectively etching the dielectric layer (56) proximate to the emissive edge (94) so that electrons emitted by the emissive edge (94) are received by the conductive layer (54).

21 Claims, 7 Drawing Sheets

500

METHOD FOR FABRICATING AN INTEGRATED FIELD EMISSION DEVICE

FIELD OF THE INVENTION

The present invention pertains to the field of field emission devices and, more particularly, to a method for fabricating a field emission device.

BACKGROUND OF THE INVENTION

Field emission devices and addressable matrices of field emission devices are known in the art. Prior art methods for fabricating these field emission devices typically involve the independent fabrication of an anode plate and a cathode plate. In the final packaging steps of the device, the anode and cathode plates must be accurately aligned. Separate fabrication of the anode and cathode plates has many disadvantages. One problem involves contamination of device elements when the cathode and anode plates are brought together for alignment. Another problem is the difficulty of the alignment itself.

A well known electron emissive structure used in field emission devices is a conical emitter generally referred to as a Spindt tip. The schemes for making Spindt tips are complex and costly. They also limit the configurations of the Spindt tips with respect to the electrodes of the device. Typically, the distance between the Spindt tips and the electron-receiving anode has a minimum value. This minimum distance is required to prevent arcing between the anode and other electrodes. This results in excessive voltage and power requirements.

Another disadvantage with this minimum distance is that the electrons emitted at the emissive structure must travel a greater distance to reach the anode. When the device is used in a field emission display, the greater travel distance results in larger spot sizes at the anode. Adequate resolution and color purity necessitate a small spot size. To provide the smaller spot size, focusing electrodes are commonly added to the device. However, these additional elements add expense and complexity to prior art processes.

Field emission devices also require the inclusion of gettering material for the removal of gaseous contaminants. Prior art getter configurations add undesirable weight and volume to the device. In one prior art scheme, a backplate is added behind the cathode plate to form a plenum for housing the getter. In this prior art configuration, the additional backplate adds substantial weight to the device.

Thus, there exists a need for a method for fabricating a field emission device that allows integrated fabrication of the anode and cathode elements. There further exists a need for a method for fabricating a field emission device that is less complex and that permits greater design choice with respect to the configuration between the emissive structures and the electrodes of the device. There also exists a need for a getter configuration that reduces the weight of the device.

Figure 1:
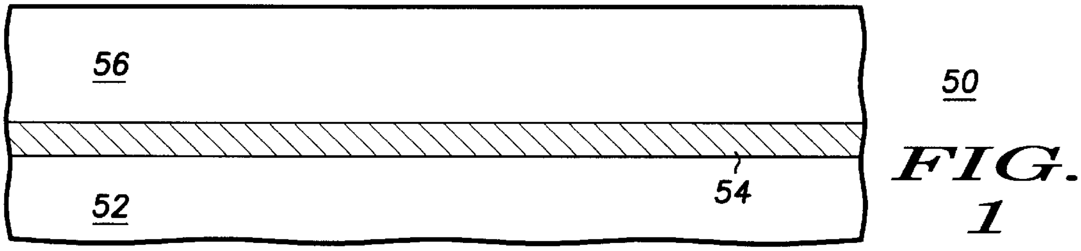
FIGS. 1–4 are cross-sectional views of structures formed in a method for fabricating an integrated diode field emission device, in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DESCRIPTION OF THE PREFERRED EMBODIMENT

The method of the invention simplifies the fabrication of field emission devices. It eliminates the step of aligning separate cathode and anode plates. The invention also provides greater control over the distances between the emission tip and both the gate extraction electrode and the anode. For example, the distance between the emission tip and anode can be made smaller than the tip-to-anode distances permitted by the prior art. Smaller tip-to-anode distances reduce voltage and power requirements for the device. The present method further reduces electron "bleeding" in field emission displays and provides for dense pixel configurations that improve display resolution.

FIGS. 1–4 illustrate, in cross-section, process steps in accordance with the invention for fabricating an integrated field emission device 90. Referring now to FIG. 1, a structure 50 includes a substrate 52, which is made from a hard material, such as glass, silicon, and the like. Upon a major surface of substrate 52 is formed a conductive layer 54, which may be made from aluminum or other convenient conductor.

Figure 2:
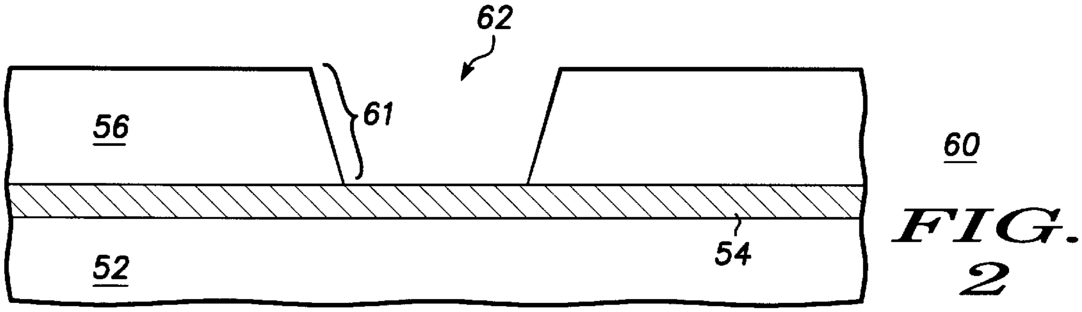

A dielectric layer 56 is deposited on conductive layer 54. Dielectric layer 56 is made from a dielectric, such as silicon dioxide, silicon nitride, and the like. Dielectric layer 56 is formed by a convenient deposition method, such as PECVD, APCVD, a spin-on-glass process, and the like. As illustrated in FIG. 2, an emission well 62 is formed by selectively removing a portion of dielectric layer 56. Dielectric layer 56 defines a wall 61. Wall 61 and conductive layer 54 define emission well 62.

Figure 3:
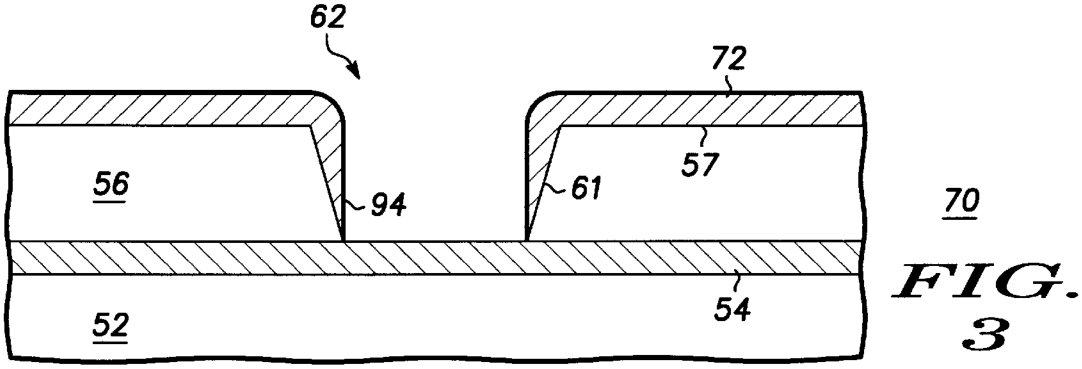

As illustrated in FIG. 3, an emissive film 72 is formed on a major surface 57 of dielectric layer 56 and on a portion of wall 61. Emissive film 72 is made from a electron emissive material, such as molybdenum, diamond-like carbon, and the like. Emissive film 72 extends partially into emission well 62 and includes an emissive edge 94, which is disposed along the height of wall 61. Emissive edge 94 has a low radius of curvature to facilitate electron emission.

In the embodiment of FIG. 3, emissive film 72 is formed by performing an static angled deposition of a gaseous source of the emissive material. The static angled deposition is performed by one of several techniques, such as electron beam evaporation, thermal evaporation, and the like. The deposition angle is within a range of 0–90° with respect to major surface 57 of dielectric layer 56. This angle is maintained throughout the deposition. The depth to which emissive film 72 extends into emission well 62 is determined, in part, by the value of the deposition angle with respect to major surface 57 of dielectric layer 56. This depth is also determined by the diameter of emission well 62. The distance between emissive edge 94 and conductive layer 54 is controlled by predetermining the deposition angle. Thus, the distance between emissive edge 94 and conductive layer 54 depends upon the deposition angle, the diameter of emission well 62, and the thickness of dielectric layer 56.

The low radius of curvature of emissive edge 94 is enhanced by the shadowing effect of emissive film 72. The electron emissive material, which is deposited on major surface 57, forms a mask for the deposition within emission well 62. Emissive edge 94 is formed during the initial stage of the angled deposition. Subsequent to the formation of emissive edge 94, emissive film 72 on major surface 57 prevents additional material from being deposited on emissive edge 94.

Figure 4:
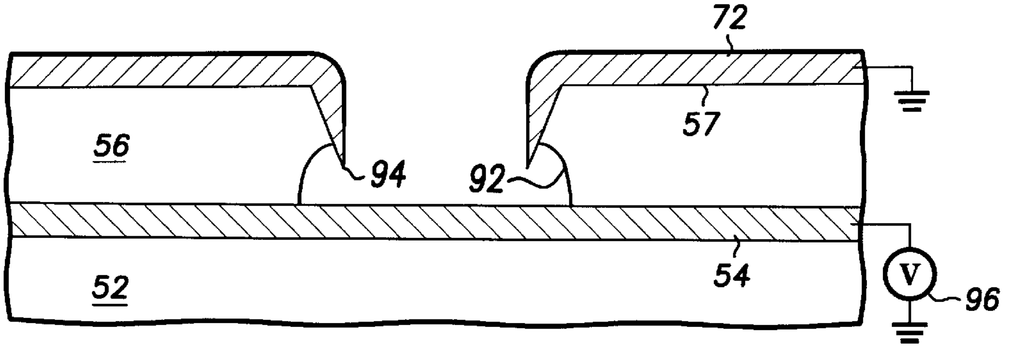

Dielectric layer 56 is selectively etched proximate to emissive edge 94 to form a setback 92 in dielectric layer 56, as illustrated in FIG. 4. Integrated field emission device 90 is operated by connecting a voltage source 96 to conductive layer 54. Emissive film 72 is grounded and conductive layer 54 is held at a higher potential than emissive film 72. Electrons are emitted at emissive edge 94 and collected at conductive layer 54. Setback 92 provides an unobstructed path for the emitted electrons.

Figure 5:
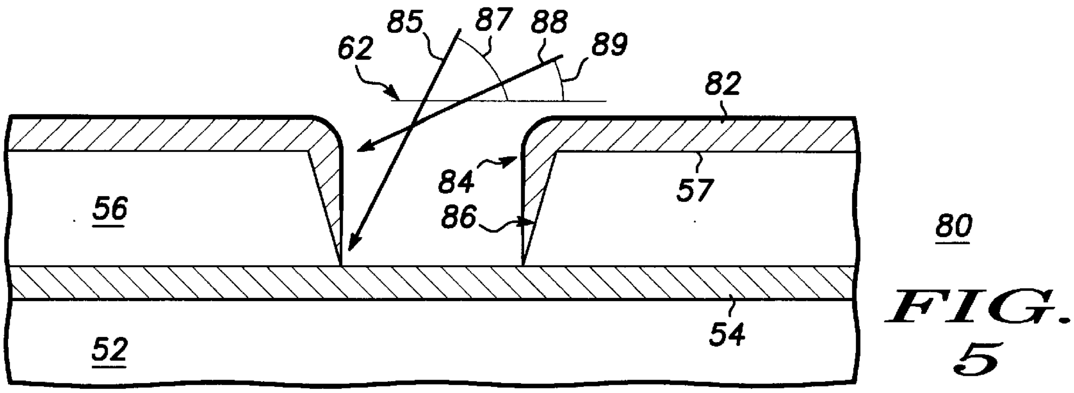
FIG. 5 is a cross-sectional view of another embodiment of an integrated diode field emission device fabricated in accordance with the invention.

FIG. 5 illustrates, in cross-section, another embodiment of an integrated field emission device fabricated in accordance with the invention. The embodiment of FIG. 5 includes a diode structure. An emissive film 82 is formed on major surface 57 of dielectric layer 56 and on a portion of wall 61.

In the embodiment of FIG. 5 the step of forming emissive film 82 includes a dynamic angled deposition. First a gaseous source of an emissive material 85 is directed toward major surface 57 of dielectric layer 56 using an initial deposition angle 87, which is within a range of 10–80 degrees. Deposition at initial deposition angle 87 forms a thin lower wedge portion including an emissive edge 86. After emissive edge 86 is formed, a gaseous source of an emissive material 88 is deposited using a second deposition angle 89, which is less than initial deposition angle 87. The deposition at second deposition angle 89 forms a thicker upper portion 84 of emissive film 82 within emission well 62.

Figure 6:
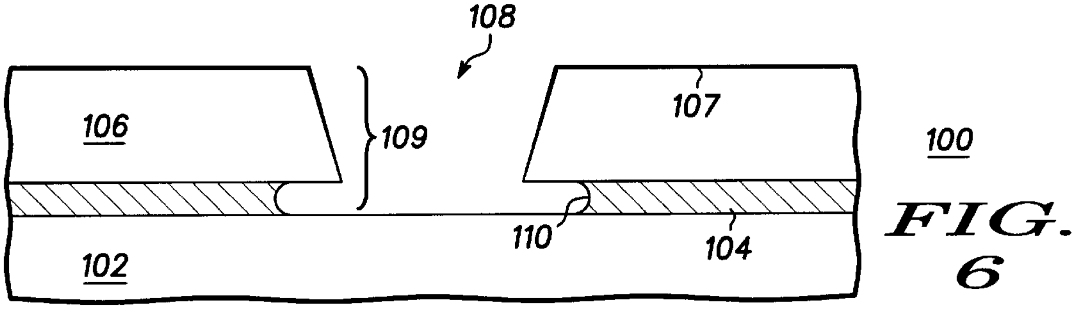
FIGS. 6–8 are cross-sectional views of structures formed in yet another embodiment of a method for fabricating an integrated diode field emission device, in accordance with the invention.
Figure 7:
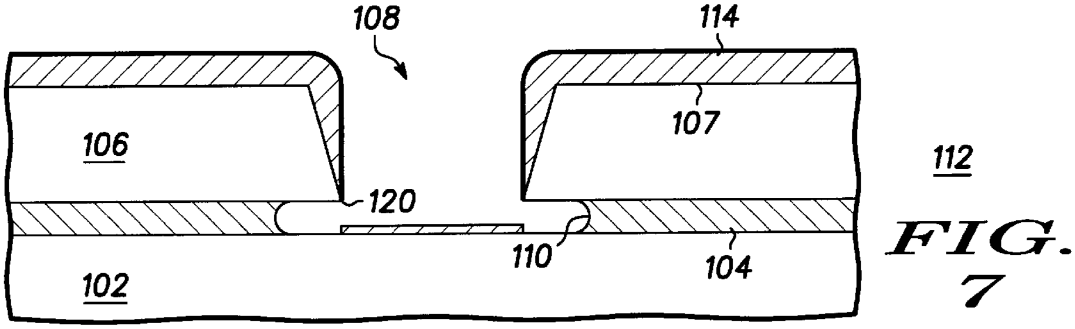
Figure 8:
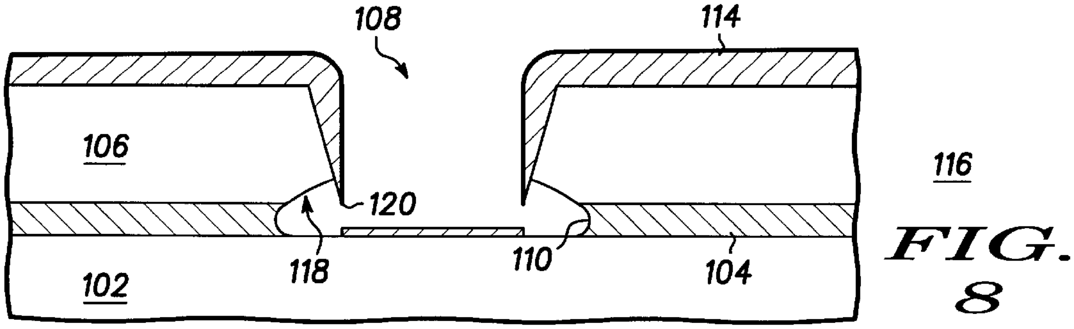

FIGS. 6–8 illustrate, in cross-section, process steps in accordance with the invention for fabricating an integrated field emission device 116. Structure 100, illustrated in FIG. 6, is formed by performing upon a structure similar to that in FIG. 2 the additional step of selectively etching a conductive layer 104 to form an etchback 110 therein. An emission well 108 is defined by a substrate 102, etchback 110, and a dielectric layer 106. Etchback 110 and dielectric layer 106 define a wall 109 of emission well 108.

As illustrated in FIG. 7, an emissive film 114 is formed upon structure 100 of FIG. 6. Emissive film 114 includes an electron emissive material, such as molybdenum, diamond-like carbon, and the like. In the particular embodiment of FIG. 7, emissive film 114 is formed by using a normal deposition. That is, the deposition angle with respect to major surface 107 of dielectric layer 106 is about 90°. During this normal deposition a gaseous source of the electron emissive material is deposited onto a major surface 107 of dielectric layer 106 and onto that portion of wall 109 which is defined by dielectric layer 106. Emissive film 114 includes an emissive edge 120. The normal deposition and etchback 110 result in the formation of an emissive edge 120 defined by emissive film 114 at the lower edge of dielectric layer 106.

After the formation of emissive film 114, and as illustrated in FIG. 8, dielectric layer 106 is selectively etched proximate to emissive edge 120. During this step, an etchback 118 is formed in dielectric layer 106. In the operation of integrated field emission device 116, conductive layer 104 is held at a potential higher than that of emissive film 114. The potential difference required to extract electrons from emissive edge 120 depends, in part, upon the distance between emissive edge 120 and conductive layer 104 and upon the identity of the material comprising emissive film 114.

In the embodiment of FIG. 8, electrons emitted from emissive edge 120 are collected at conductive layer 104. The distance between emissive edge 120 and conductive layer 104 is determined by the extent of etchback 110.

Figure 9:
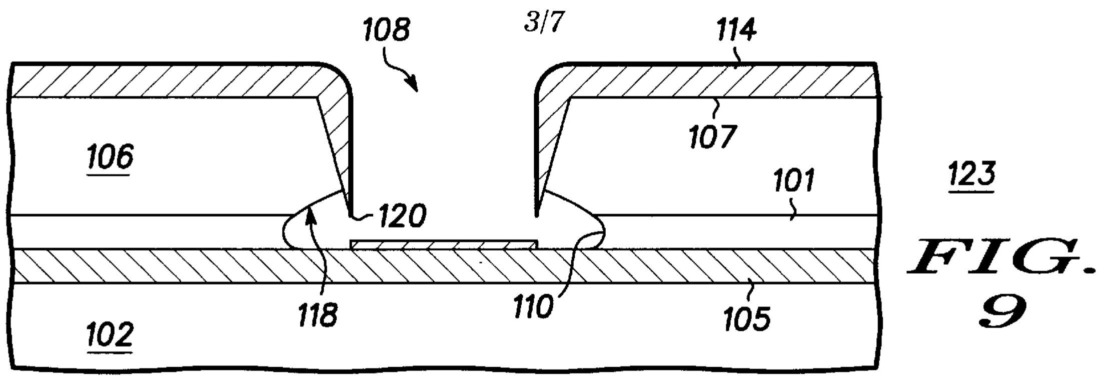
FIG. 9 is a cross-sectional view of an integrated diode field emission device fabricated in accordance with the invention.

FIG. 9 illustrates, in cross-section, an integrated field emission device 123 fabricated in accordance with the present invention. Integrated field emission device 123 includes a diode structure. Integrated field emission device 123 has a substrate 102, a conductive layer 105, an etchback layer 101, dielectric layer 106, and emissive film 114. In the embodiment of FIG. 9, the break in the wall defining emission well 108 is provided by forming etchback 110 in etchback layer 101. Etchback layer 101 is made from a dielectric different from the dielectric of dielectric layer 106, so that it can be selectively etched.

Integrated field emission device 123 is formed by first depositing conductive layer 105, which includes a convenient conductive material, such as aluminum. Thereafter, etchback layer 101 is formed on conductive layer 105. Then, dielectric layer 106 is deposited onto etchback layer 101. Dielectric layer 106 is selectively etched, and etchback layer 101 is selectively etched to form etchback 110 therein. Etchback 110 is retracted from the wall defined by dielectric layer 106.

After forming etchback 110, emissive film 114 is deposited using a normal deposition, as described with reference to FIG. 7. The normal deposition results in emissive film 114 being disposed on major surface 107, the wall defined by dielectric layer 106, and on a portion of conductive layer 105, at the bottom of emission well 108. Etchback 110 prevents emissive film 114 from being deposited on etchback layer 101 and results in the formation of emissive edge 120 at the bottom edge of dielectric layer 106. After the deposition of emissive film 114, dielectric layer 106 is selectively etched to form etchback 118 proximate emissive edge 120.

During the operation of integrated field emission device 123, potentials are applied to emissive film 114 and conductive layer 105 for extracting electrons from emissive edge 120. These extracted electrons are collected at conductive layer 105.

Figure 10:
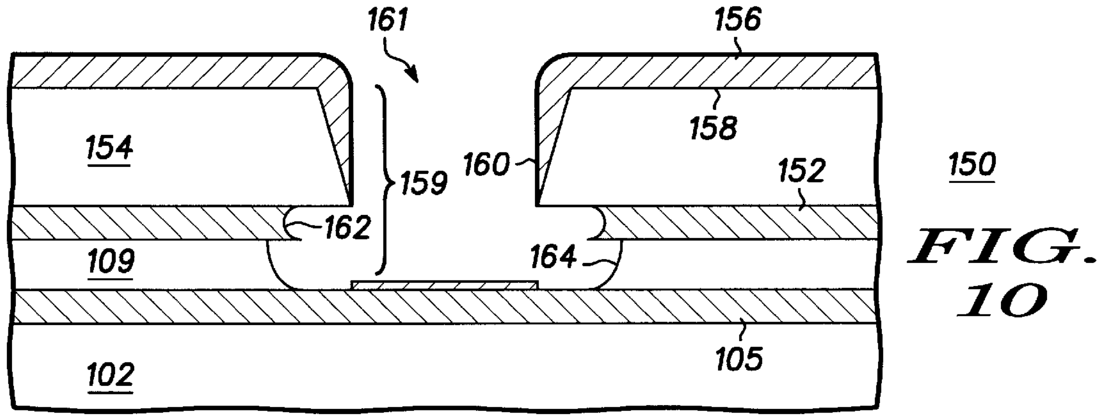
FIGS. 10 and 11 are cross-sectional views of structures formed in a method for fabricating an integrated triode field emission device, in accordance with the invention.
Figure 11:
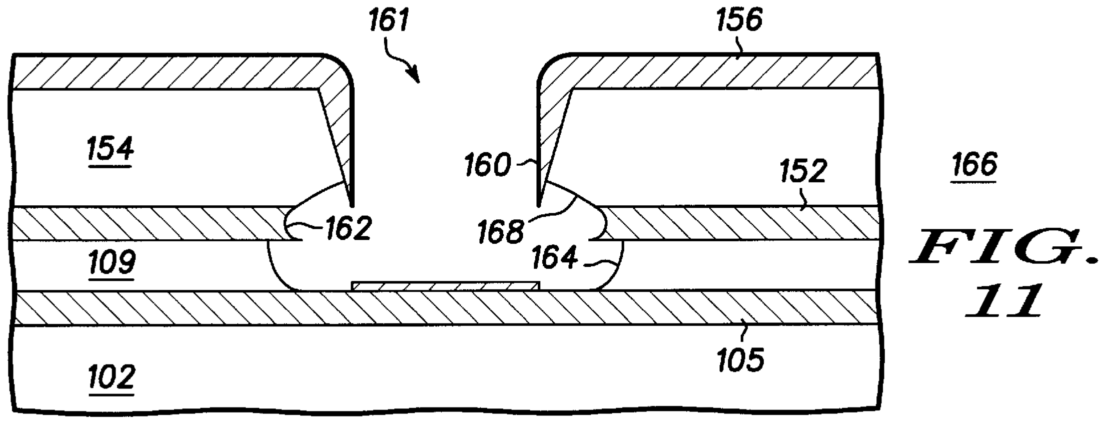

FIGS. 10 and 11 illustrate, in cross-section, process steps in accordance with the invention for fabricating an integrated field emission device 166. Integrated field emission device 166 includes a triode structure.

As shown in FIG. 10, integrated field emission device 166 is formed by first depositing conductive layer 105 on substrate 102. Then, a first dielectric layer 109 is deposited on conductive layer 105. A second conductive layer 152 is formed on first dielectric layer 109, and a second dielectric layer 154 is formed on second conductive layer 152.

An emission well 161 is formed next by selectively removing a portion of second dielectric layer 154, a portion of second conductive layer 152, and a portion of first dielectric layer 109. A wall 159 is defined by second dielectric layer 154, second conductive layer 152, and first dielectric layer 109.

After forming emission well 161, an etchback 162 is formed in second conductive layer 152, and an etchback 164 is formed in first dielectric layer 109. Etchbacks 162, 164 are retracted from the portion of wall 159 defined by second dielectric layer 154.

After etchbacks 162, 164 are formed, an emissive film 156 is deposited. In the particular embodiment of FIG. 10, emissive film 156 is formed using a normal deposition of a gaseous source of an emissive material, similar to that described with reference to FIG. 7. The normal deposition results in emissive film 156 being disposed on major surface 158, the portion of wall 159 defined by second dielectric layer 154, and on a portion of conductive layer 105, at the bottom of emission well 161. Etchbacks 162, 164 prevent the deposition of emissive material on second conductive layer 152 and on first dielectric layer 109. In this manner an emissive edge 160 is formed in emissive film 156 at the lower edge of second dielectric layer 154.

Referring now to FIG. 11, subsequent to the deposition of emissive film 156, second dielectric layer 154 is selectively etched, such that an etchback 168 is formed therein proximate to emissive edge 160. In the operation of integrated FED 166, potentials are applied to emissive film 156, second conductive layer 152, and conductive layer 105 to extract electrons from emissive edge 160. These extracted electrons are collected at conductive layer 105.

Figure 12:
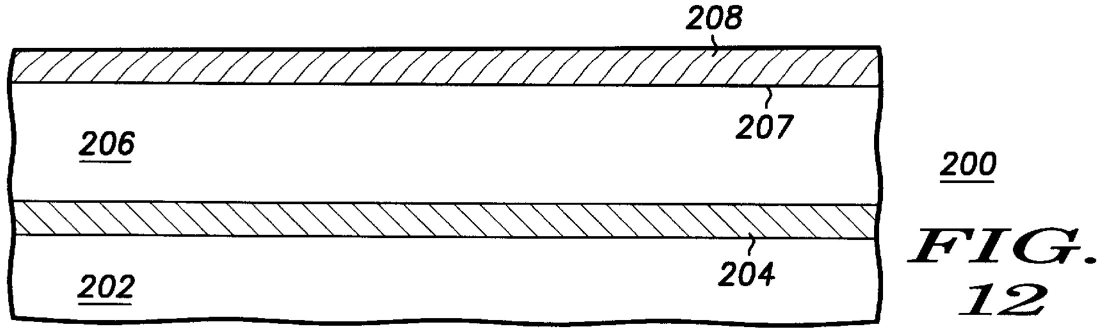
FIGS. 12 and 13 are cross-sectional views of structures fabricated in a further embodiment of a method for fabricating an integrated diode field emission device, in accordance with the invention.
Figure 13:
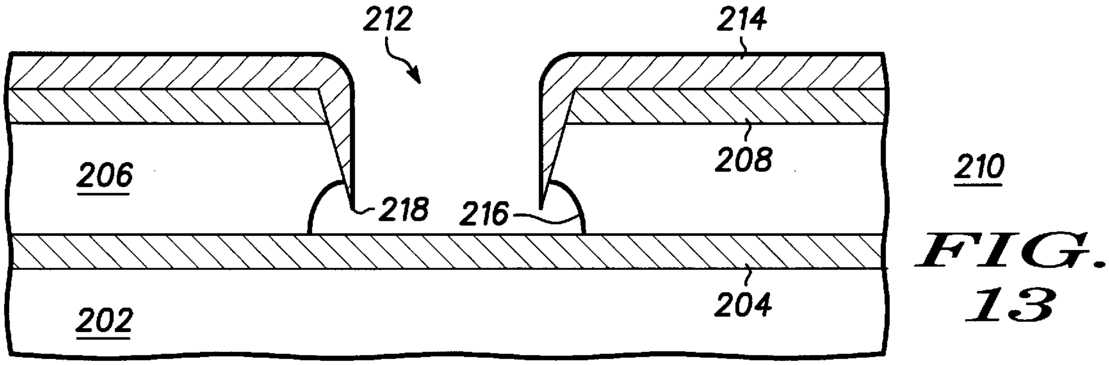

FIGS. 12 and 13 illustrate, in cross-section, process steps in accordance with the invention for fabricating an integrated field emission device 210. Integrated field emission device 210 includes a diode configuration which further includes a ballast layer 208. Illustrated in FIG. 12, a structure 200 includes the elements of structure 50 (FIG. 1) and further includes ballast layer 208, which is formed on a major surface 207 of a dielectric layer 206. An emission well 212 is formed by selectively etching through ballast layer 208 and dielectric layer 206. After forming emission well 212, an emissive film 214 is formed on ballast layer 208 and on a portion of dielectric layer 206 which defines emission well 212. Emissive film 214 is formed using an angled deposition, such as the static angled deposition described with reference to FIG. 3 or the dynamic angled deposition described with reference to FIG. 5. Emissive film 214 includes an emissive edge 218, which is disposed within emission well 212. Then, dielectric layer 206 is selectively etched proximate to emissive edge 218 to form a setback 216 in dielectric layer 206.

Ballast layer 208 is made from a resistive material, such as amorphous silicon. Ballast layer 208 allows the emission current to be evenly distributed between the various emitters and prevents device arc down. Ballast layer 208 reduces the adverse effects of current overloads, such as blow-outs of emissive edges 218.

In another embodiment of the invention, an integrated field emission device is formed having the configuration depicted in FIG. 13. However, in this embodiment, layer 208 is made from a conductive material. The other elements are the same as described with reference to FIG. 13. Conductive layer 208 is in parallel with emissive film 214. This is a convenient configuration if emissive film 214 does not adequately conduct current.

Figure 14:
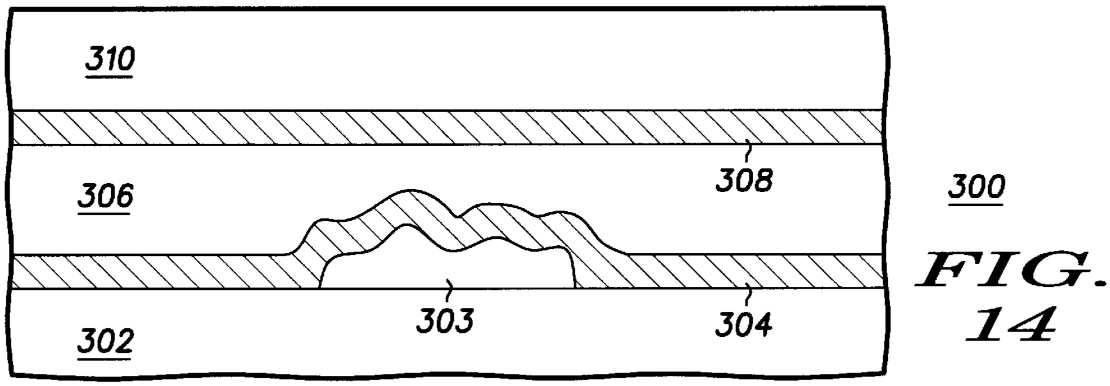
FIGS. 14–18 are cross-sectional views of structures formed in another embodiment of a method for fabricating an integrated triode field emission device, in accordance with the invention.

FIGS. 14–18 illustrate, in cross-section, process steps in accordance with the invention for fabricating an integrated field emission device 324. Field emission device 324 includes a triode structure and further includes a phosphor deposit 303. A structure 300, which is illustrated in FIG. 14, includes a substrate 302. Substrate 302 is made from a hard material, such as a glass, silicon, and the like. The glass may include borosilicate, soda lime glass, and the like. Substrate 302 may further include a conductive film for providing a potential thereto.

Phosphor deposit 303 is formed on a major surface of substrate 302. Phosphor deposit 303 is made from a cathodoluminescent material which emits light upon electron bombardment. A first conductive layer 304 is formed on phosphor deposit 303.

First conductive layer 304 is made from a material which protects phosphor deposit 303 from subsequent processing steps. First conductive layer 304 may also provide the anode electrode of the device. In the preferred embodiment, first conductive layer 304 is made from a metal, preferably molybdenum or aluminum. First conductive layer 304 is deposited using a convenient deposition process, such as sputtering, evaporation, and the like, to a thickness of about 5000 angstroms.

After the deposition of first conductive layer 304, first dielectric layer 306 is deposited on first conductive layer 304. First dielectric layer 306 is made from a dielectric material, such as silicon dioxide, a polyimide, a borophosphosilicate glass, and the like. This dielectric material is deposited using a planarization process so that first dielectric layer 306 has a major surface 307 that is planar. In the preferred embodiment, first dielectric layer 306 is formed from silicon dioxide using a spin-on-glass process. A polyimide dielectric is planarized using a reflow process. A borophosphosilicate glass dielectric is planarized using a higher temperature reflow process.

After the formation of first dielectric layer 306, a second conductive layer 308 is deposited on first dielectric layer 306. Second conductive layer 308 is made from a conductive material, such as molybdenum, aluminum, and the like. A second dielectric layer 310 is then formed on second conductive layer 308. Second dielectric layer is made from a dielectric material, such as silicon dioxide, silicon nitride, and the like, which is deposited by a convenient deposition process. The thickness of second dielectric layer 310 is about 2–5 microns.

Figure 15:
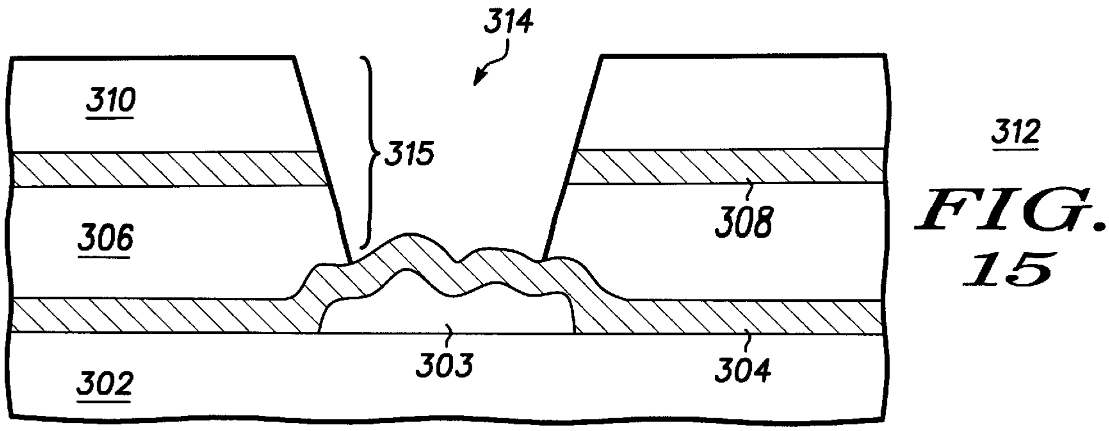

As illustrated in FIG. 15, an emission well 314 is formed by selectively removing portions of second dielectric layer 310, second conductive layer 308, and first dielectric layer 306, such that emission well 314 overlies phosphor deposit 303. A wall 315 is defined by first and second dielectric layers 306, 310 and by second conductive layer 308. Wall 315 and first conductive layer 304 define emission well 314.

Figure 16:
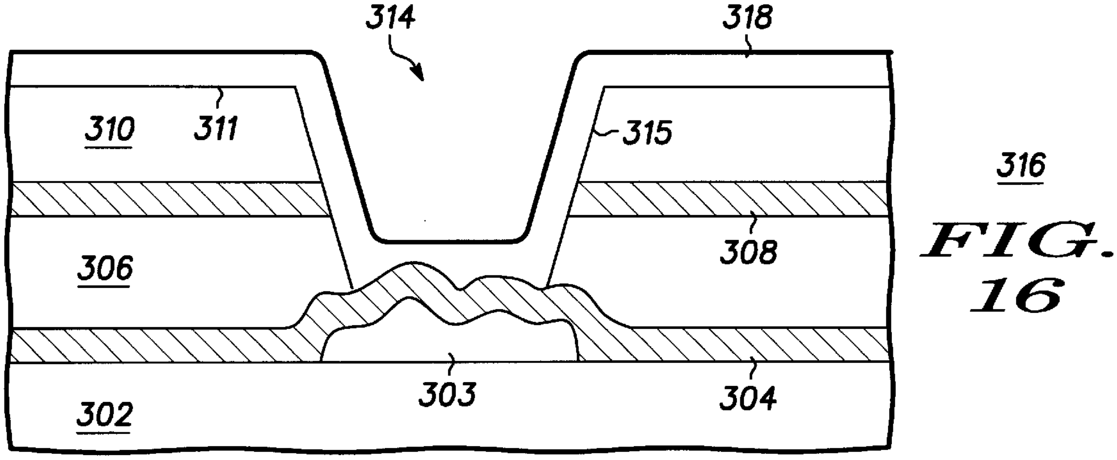

Subsequent to the formation of emission well 314, as illustrated in FIG. 16, a spacer layer 318 is formed. Spacer layer 318 is disposed on a major surface 311 of second dielectric layer 310 and on the surfaces defining emission well 314. Spacer layer 318 is made from a dielectric material, such as silicon dioxide, silicon nitride, and the like. The thickness of spacer layer 318 at wall 315 is predetermined to provide a desired inter-electrode spacing, as will be described in greater detail with reference to FIG. 17. Spacer layer 318 is deposited using a convenient deposition method, such as PECVD.

Figure 17:
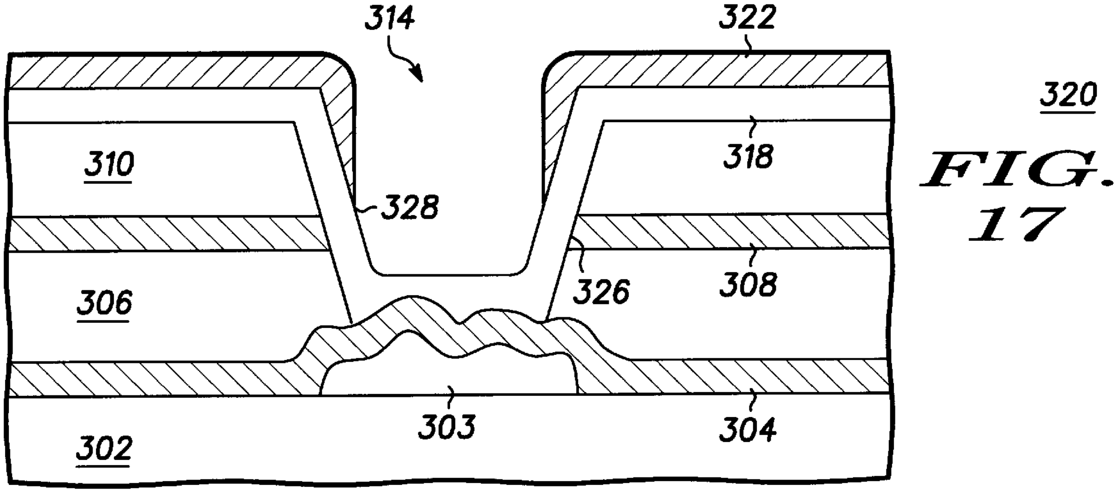

After the formation of spacer layer 318, an emissive film 322 is formed, as illustrated in FIG. 17. Emissive film 322 is made from an electron emissive material, such as molybdenum, diamond-like carbon, and the like. Emissive film 322 extends partially into emission well 314 and includes an emissive edge 328. Emissive edge 328 opposes an edge 326 of second conductive layer 308. In the embodiment of FIG. 17, emissive film 322 is deposited using an angled evaporation, as described with reference to FIGS. 3 and 5. The deposition angle is within a range of 0–90°, preferably within a range of 20–45°. The value of the deposition angle depends upon the diameter of emission well 314, and the depth at which second conductive layer 308 is disposed.

Figure 18:
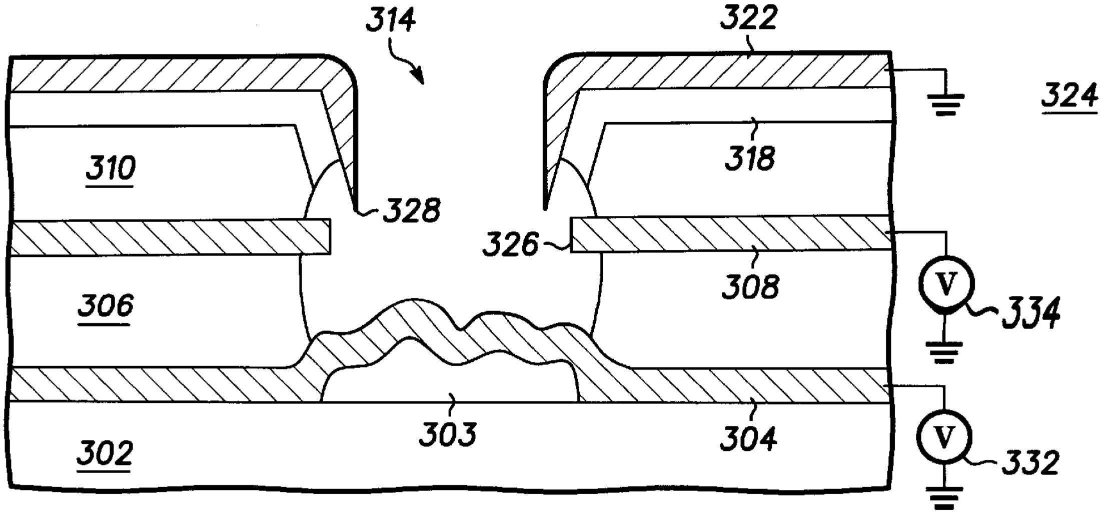

As illustrated in FIG. 18, subsequent to the angled deposition of emissive film 322, a portion of spacer layer 318 proximate to emissive edge 328 is selectively etched. Portions of first and second dielectric layers 306, 310 may also be etched during this step. Then, first conductive layer 304 is selectively etched to reduce its thickness to less than about 500 angstroms.

In the preferred embodiment, spacer layer 318 is made from silicon nitride, first conductive layer 304 is made from molybdenum or aluminum, and emissive film 322 is made from molybdenum. The step of selectively etching spacer layer 318 includes etching with an $SF_6$ reactive ion etch. During this etch, spacer layer 318 is pulled away from emissive edge 328, first conductive layer 304 is thinned, and emissive edge 328 is shaped.

The operation of integrated field emission device 324 includes holding emissive film 322 at ground potential, connecting a potential source 334 to second conductive layer 308 to apply a higher potential thereto, and connecting a second potential source 332 to first conductive layer 304 for applying a potential thereto which is more positive than that of second conductive layer 308. Electrons are thereby extracted from emissive edge 328. The emitted electrons are attracted to first conductive layer 304 and received thereby. First conductive layer 304 is thinned to reduce voltage loss of the electrons as they traverse first conductive layer 304 to be received by phosphor deposit 303.

Figure 19:
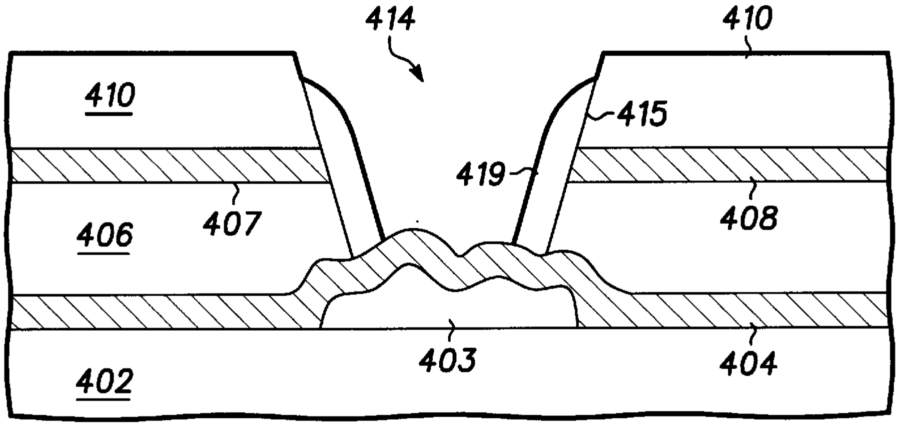
FIGS. 19–21 are cross-sectional views of structures formed in yet another embodiment of a method for fabricating an integrated triode field emission device, in accordance with the invention.
Figure 20:
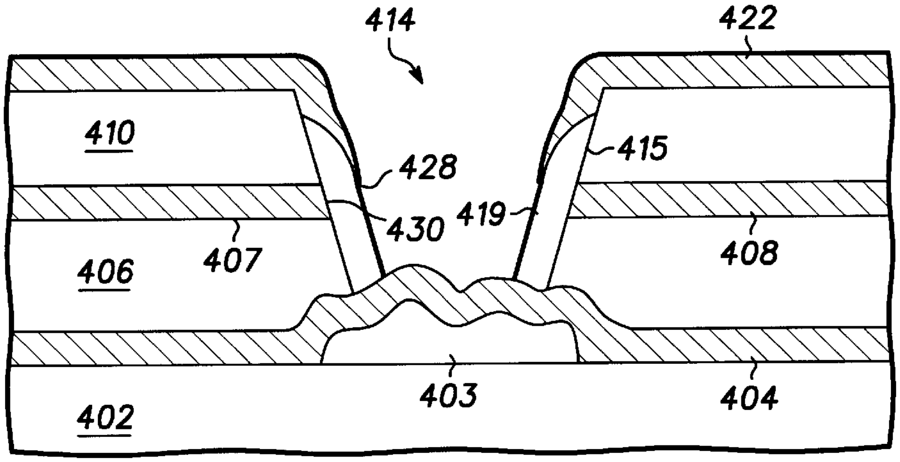
Figure 21:
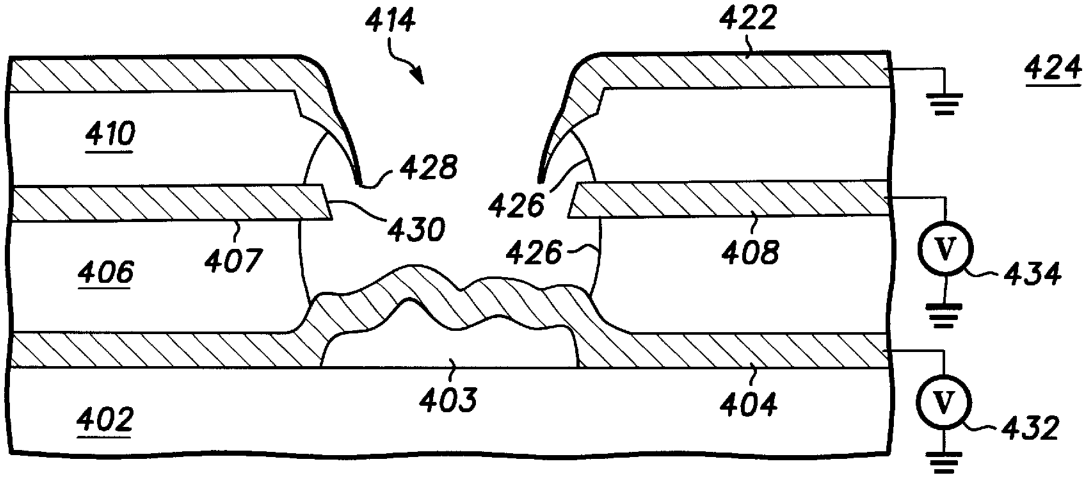

FIGS. 19–21 illustrate, in cross-section, process steps in accordance with the invention for fabricating an integrated field emission device 424, which has a triode configuration. The fabrication of the embodiment of FIG. 21 utilizes a spacer configuration that differs from that used to fabricate the embodiment of FIG. 18. Referring now to FIG. 19, a structure 400 is fabricated by first forming structure 316 as described with reference to FIGS. 14–16. Elements of structure 400 which are the same as those of structure 316 are similarly referenced, beginning with a "4". To form structure 400, spacer layer 318 of structure 316, which is illustrated in FIG. 16, is selectively etched using reactive ion etching. This selective etch of spacer layer 318 forms a spacer layer 419, which is disposed only upon a wall 415 defining an emission well 414.

After the formation of spacer layer 419, an emissive film 422 is deposited using an angled deposition, as described with reference to FIGS. 3 and 5. Emissive film 422 extends into emission well 414 so that an emissive edge 428 opposes an edge 430 of a second conductive layer 408. The thickness of spacer layer 419 defines the distance between emissive edge 428 and edge 430 of second conductive layer 408.

Following the deposition of emissive film 422, a portion of spacer layer 419 proximate to emissive edge 428 is selectively etched, as depicted in FIG. 21. Spacer layer 419 and first and second dielectric layers 406, 410 are made from silicon dioxide and/or silicon nitride. So, the step of selectively etching a portion of spacer layer 419 also forms an etchback 426 in first and second dielectric layers 406, 410.

Figure 22:
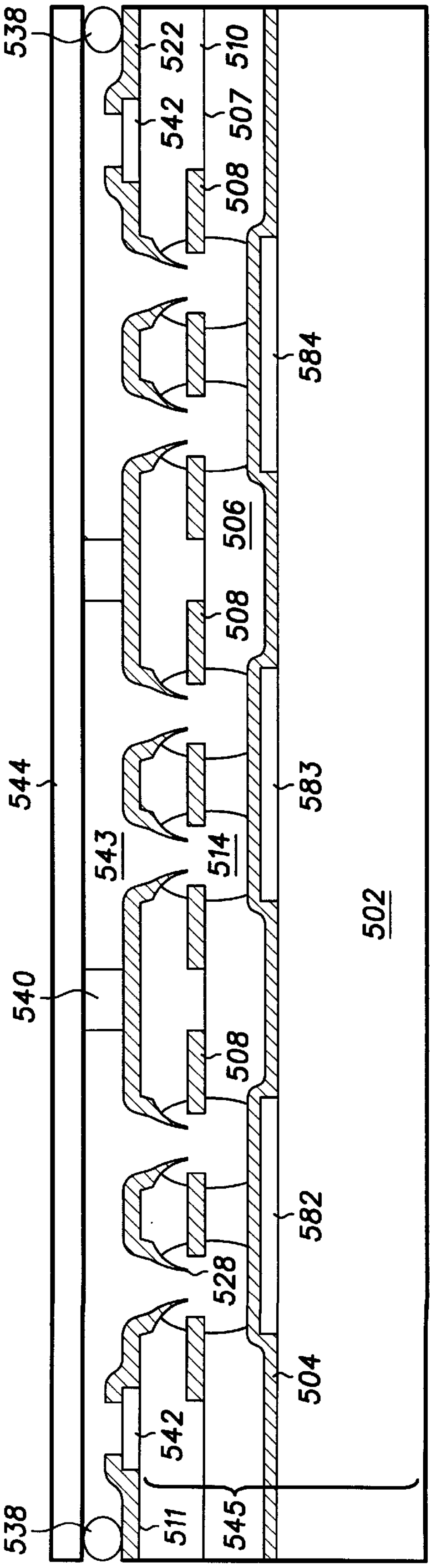
FIG. 22 is a cross-sectional view of an integrated field emission display fabricated in accordance with the invention.

FIG. 22 illustrates, in cross-section, an integrated field emission display (FED) 500 fabricated in accordance with the invention. Integrated FED 500 includes a transparent substrate 502, which is made from a hard, transparent material, such as borosilicate glass, soda lime glass, and the like. Transparent substrate 502 may further include a conductive film for applying a potential thereto.

Upon transparent substrate 502 is affixed a plurality of phosphor deposits 582, 583, 584. For ease of understanding, FIG. 22 illustrates only one pixel, which includes three phosphor subpixels. Phosphor deposit 582 emits red light; phosphor deposit 583 emits green light, and phosphor deposit 584 emits blue light. An FED generally includes an array of such pixels.

Thereafter, a conductive layer 504 is formed on phosphor deposits 582, 583, 584. Conductive layer 504 is made from a material which protects phosphor deposits 582, 583, 584 from subsequent processing steps. Conductive layer 504 may also provide the anode electrode of integrated FED 500. In the preferred embodiment, conductive layer 504 is made from a metal, preferably molybdenum or aluminum. Conductive layer 504 is deposited using a convenient deposition process, such as sputtering, evaporation, and the like, to a thickness of less than 1000 angstroms.

Following the formation of conductive layer 504, a first dielectric layer 506 is deposited on conductive layer 504. First dielectric layer 506 is made from a dielectric material which can be deposited using a planarization process to impart a planar surface to first dielectric layer 506. In the preferred embodiment, first dielectric layer 506 is formed from silicon dioxide using a spin-on-glass process. The thickness of first dielectric layer 506 is greater than one micrometer.

After the deposition of first dielectric layer 506, a plurality of conductive rows 508 is formed on a major surface 507 of first dielectric layer 506. Conductive rows 508 are made from a conductive material, such as molybdenum, aluminum, and the like. The formation of conductive rows 508 includes, first, depositing a layer of the conductive material onto major surface 507. Then, the layer is patterned to define spaced apart rows.

Subsequent to the patterning of conductive rows 508, a second dielectric layer 510 is formed on conductive rows 508. Second dielectric layer 510 is made from a dielectric material, such as silicon dioxide, silicon nitride, and the like, which is deposited by a convenient deposition process. The thickness of second dielectric layer 510 is about 1 micron.

Following the formation of second dielectric layer 510, a plurality of emission wells 514 are formed by selectively removing portions of second dielectric layer 510, conductive rows 508, and first dielectric layer 506 overlying phosphor deposits 582, 583, 584. To facilitate understanding, FIG. 22 depicts only two emission wells per subpixel. Generally, about 200 emission wells are formed in registration with each subpixel.

After the formation of emission wells 514, a conductive column 522 is formed on second dielectric layer 510.

Conductive column 522 crosses each of conductive rows 508 at an angle to conductive rows 508, preferably at an angle of 90°. In this manner, each subpixel can be selectively addressed. This is done by applying a first potential to conductive column 522 and applying a second potential, higher than the first potential, to the one of conductive rows 508 which defines the subpixel being addressed.

Conductive column 522 extends partially into each of plurality of emission wells 514 to define an emissive edge 528 within each of emission wells 514. Each emissive edge 528 is spaced a predetermined distance from the one of conductive rows 508 that partially defines the emission well in which it is disposed. Each emissive edge 528 is further spaced a predetermined distance from conductive layer 504. These distances depend upon factors such as the predetermined potential differences between conductive column 522, conductive rows 508, and conductive layer 504.

In an example configuration, conductive column 522 is held at ground potential, conductive rows 508 are held at about 50 volts, conductive layer 504 is held at a voltage greater than 100 volts. For this voltage configuration, the distance between emissive edge 528 and the adjacent one of conductive rows 508 is less than 2000 angstroms, and the distance between emissive edge 528 and the underlying portion of conductive layer 504 is greater than 1 micron.

This physical configuration is realized by performing steps similar to those described with reference to FIGS. 16–21. A spacer layer is formed within plurality of emission wells 514. Then, an emissive film is formed on the spacer layer and overlying a major surface 511 of second dielectric layer 510. This deposition includes an angled deposition of the emissive material. The deposition angle is selected so that each emissive edge 528 opposes the adjacent one of conductive rows 508. Then, the spacer layer is selectively etched proximate to each emissive edge 528 so that electrons emitted from each emissive edge 528 are attracted to, and received by, conductive layer 504. A normal deposition, such as that described with reference to FIGS. 10 and 11, can also be employed to form this physical configuration.

Conductive column 522 is patterned to form a plurality of parallel columns. The plurality of parallel columns and conductive rows 508 are used to address an array of subpixels. Conductive column 522 is electrically connected in series with a ballast resistor 542 at each pixel. Ballast resistor 542 is made from a resistive material, preferably amorphous silicon. Ballast resistor 542 reduces the adverse effects of current overloads, such as blow-outs of emissive edges 528.

In the embodiment of FIG. 22, each of emission wells 514 has a circular opening and cross-section. This emission well geometry imparts a annular geometry to each emissive edge 528. Emissive edge 528 defines a ring which opposes the one of conductive rows 508 defining the one of emission wells 514 in which emissive edge 528 is disposed.

In a further embodiment, each emission well has a polygonal opening, such as a triangular opening. In this embodiment, the step of forming a conductive column on the second dielectric layer includes the step of rotating the substrate during the deposition of the emissive material. In yet another embodiment each emission well includes a trench.

In contrast to prior art methods for fabricating field emission displays, the present invention provides the important advantage of greater control over, and variability of, the distances between the emissive structure and the other electrodes of the field emission display. One resulting advantage is greater flexibility in the design of operating voltages. In particular, the emissive edge can be placed in close proximity to the collection anode so that the anode voltage may be reduced. This configuration reduces power requirements. Another important advantage of this configuration is reduced need for focusing of the electron beams.

Another important advantage of the present invention is that an integrated structure 545 is realized. As illustrated in FIG. 22, integrated structure 545 includes only one substrate onto which are formed all of the electrodes of the display, the emissive structures, and the phosphors.

Integrated FED 500 further includes a sealing plate 544. Sealing plate 544 includes a hard plate, such as a glass plate, and opposes conductive column 522. A plurality of spacers 540 provide standoff between integrated structure 545 and sealing plate 544. Spacers 540 include support structures, such as ribs of glass. Spacers 540 have dimensions to fit on conductive column 522, between adjacent ones of emission wells 514. Sealing plate 544 is hermetically sealed, using a frit sealant 538, to integrated structure 545 at its periphery.

An interspace region 543 is thereby realized between integrated structure 545 and sealing plate 544. Interspace region 543 allows fluid communication throughout integrated FED 500 so that the device can be evacuated. Interspace region 543 also provides a volume into which getter material may be placed for collecting gaseous contaminants. This getter material may include a distributed getter, a discrete getter, and the like.

Integrated FED 500 includes a display having a plenum for the housing of getter material. This device weighs less than prior art displays that have plenums. This is because integrated FED 500 only includes two major substrates: transparent substrate 502 and sealing plate 544. Unlike the prior art, the present invention allows the formation of the electron emissive elements and the phosphor elements onto one substrate, rather than two. This reduces the weight of the display.

A method for fabricating an integrated field emission device has been disclosed. The method of the invention simplifies the fabrication of field emission devices. It also allows greater design flexibility with respect to the configuration of the electrodes. It further reduces the need for electron beam focusing. Other advantages of the present invention include: the use of lower anode voltages resulting in lower power consumption, improved getter distribution, ease of vacuum sealing, and the formation of dense pixel configurations that improve display resolution.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. A method for fabricating an integrated field emission device comprising the steps of:

providing a substrate having a major surface;

forming on the major surface of the substrate a conductive layer;

depositing on the conductive layer a dielectric layer having a major surface;

selectively removing a portion of the dielectric layer to form a wall therein, such that the wall and the conductive layer define an emission well having a depth;

forming on the major surface of the dielectric layer and on a portion of the wall an emissive film extending partially into the emission well to define an emissive edge disposed within the emission well; and selectively etching the dielectric layer proximate to the emissive edge, such that electrons emitted by the emissive edge are received by the conductive layer.

2. The method for fabricating an integrated field emission device as claimed in claim 1, wherein the step of depositing a dielectric layer includes the step of depositing a layer of spin-on-glass.

3. The method for fabricating an integrated field emission device as claimed in claim 1, further comprising, subsequent to the step of selectively removing a portion of the dielectric layer, the step of selectively etching the conductive layer, such that an etchback is formed therein, and wherein the step of forming an emissive film includes the step of directing a gaseous source of an emissive material toward the major surface of the dielectric layer, such that a deposition angle of about 90 degrees is defined with respect to the major surface of the dielectric layer.

4. The method for fabricating an integrated field emission device as claimed in claim 1, further comprising, prior to the step of forming an emissive film, the step of forming on the major surface of the dielectric layer a ballast layer.

5. A method for fabricating an integrated field emission device comprising the steps of:

providing a substrate having a major surface;

forming on the major surface of the substrate a first conductive layer;

depositing on the first conductive layer a first dielectric layer having a major surface;

depositing on the major surface of the first dielectric layer a second conductive layer;

depositing on the second conductive layer a second dielectric layer having a major surface;

selectively removing a portion of the second dielectric layer, a portion of the second conductive layer, and a portion of the first dielectric layer to form a wall therein such that the wall and the first conductive layer define an emission well having a depth; and forming an emissive film overlying the major surface of the second dielectric layer and extending partially into the emission well to define an emissive edge therein.

6. The method for fabricating an integrated field emission device as claimed in claim 5, wherein the step of selectively removing a portion of the second dielectric layer, a portion of the second conductive layer, and a portion of the first dielectric layer to form a wall further includes the steps of forming an etchback in the second conductive layer and forming an etchback in the first dielectric layer, and wherein the step of forming an emissive film includes the step of directing a gaseous source of an emissive material toward the major surface of the second dielectric layer, such that a deposition angle of about 90 degrees is defined with respect to the major surface of the second dielectric layer.

7. The method for fabricating an integrated field emission device as claimed in claim 5, further comprising the step of forming a phosphor deposit on the major surface of the substrate, and wherein the step of forming a first conductive layer includes the step of forming a first conductive layer on the phosphor deposit, and wherein the step of forming an emission well includes the step of removing those portions of the first and second dielectric layers and of the second conductive layer that overlie the phosphor deposit.

8. The method for fabricating an integrated field emission device as claimed in claim 5, wherein the step of forming an emissive film overlying the major surface of the second dielectric layer and extending partially into the emission well includes the steps of forming a spacer layer on the major surface of the second dielectric layer and on the wall defining the emission well, thereafter forming on the spacer layer an emissive film extending partially into the emission well, and thereafter selectively etching a portion of the spacer layer proximate to the emissive edge.

9. The method for fabricating an integrated field emission device as claimed in claim 5, wherein the step of forming an emissive film overlying the major surface of the second dielectric layer and extending partially into the emission well includes the steps of forming a spacer layer on the wall defining the emission well, thereafter forming on the major surface of the second dielectric layer and on the wall defining the emission well an emissive film extending partially into the emission well, and thereafter selectively etching a portion of the spacer layer proximate to the emissive edge.

10. The method for fabricating an integrated field emission device as claimed in claim 5, wherein the step of forming an emission well includes the step of forming an emission well having a circular cross-section.

11. The method for fabricating an integrated field emission device as claimed in claim 5, wherein the step of forming an emission well includes the step of forming an emission well having a polygonal cross-section.

12. The method for fabricating an integrated field emission device as claimed in claim 11, wherein the step of forming an emissive film includes the steps of directing toward the major surface of the second dielectric layer a gaseous source of an emissive material and concurrently rotating the substrate.

13. The method for fabricating an integrated field emission device as claimed in claim 5, wherein the step of forming an emissive film includes the step of directing a gaseous source of an emissive material toward the major surface of the second dielectric layer, such that a first deposition angle is defined with respect to the major surface of the second dielectric layer, the first deposition angle being within a range of 10–80°.

14. The method for fabricating an integrated field emission device as claimed in claim 13, further comprising, subsequent to the step of directing a gaseous source of an emissive material toward the major surface of the second dielectric layer, the step of directing a gaseous source of an emissive material toward the major surface of the second dielectric layer, such that a second deposition angle is defined with respect to the major surface of the second dielectric layer, the second deposition angle being less than the first deposition angle.

15. The method for fabricating an integrated field emission device as claimed in claim 5, wherein the step of forming an emissive film includes the step of forming a film made from molybdenum.

16. A method for fabricating an integrated field emission display comprising:

providing a transparent substrate having a major surface;

affixing to the major surface of the transparent substrate a plurality of phosphor deposits;

forming on the plurality of phosphor deposits a conductive layer;

forming on the conductive layer a first dielectric layer having a major surface;

forming a plurality of conductive rows on the major surface of the first dielectric layer;

forming on the plurality of conductive rows a second dielectric layer having a major surface;

removing portions of the second dielectric layer, the plurality of conductive rows, and the first dielectric layer overlying each of the plurality of phosphor deposits, thereby defining a plurality of emission wells, each of the plurality of emission wells being defined by the conductive layer and a wall, the wall being defined by the first and second dielectric layers and one of the plurality of conductive rows; and forming over the major surface of the second dielectric layer a conductive column crossing each of the plurality of conductive rows at an angle to the plurality of conductive rows, the conductive column extending partially into each of the plurality of emission wells, thereby defining an emissive edge within each of the plurality of emission wells, such that each emissive edge is spaced a distance from the conductive row and is further spaced a distance from the conductive layer.

17. The method for fabricating an integrated field emission display as claimed in claim 16, further comprising, prior to the step of forming a conductive column, the step of forming a spacer layer on each of the walls defining the plurality of emission wells, and further comprising, subsequent to the step of forming a conductive column, the step of selectively etching a portion of each spacer layer proximate to each emissive edge.

18. The method for fabricating an integrated field emission display as claimed in claim 16, further comprising the steps of providing a sealing plate having a major surface opposing and spaced from the conductive column and providing a spacer between the conductive column and the sealing plate.

19. The method for fabricating an integrated field emission display as claimed in claim 16, wherein the step of forming a first dielectric layer includes the step of depositing a layer of spin-on-glass.

20. The method for fabricating an integrated field emission display as claimed in claim 16, wherein the step of forming a conductive column includes the step of directing a gaseous source of an emissive material toward the major surface of the second dielectric layer, such that a first deposition angle within a range of 10–80° is defined with respect to the major surface of the second dielectric layer.

21. The method for fabricating an integrated field emission display as claimed in claim 20, further comprising, subsequent to the step of directing a gaseous source of an emissive material toward the major surface of the second dielectric layer, such that a first deposition angle within a range of 10–80° is defined, the step of directing a gaseous source of an emissive material toward the major surface of the second dielectric layer, such that a second deposition angle less than the first deposition angle is defined with respect to the major surface of the second dielectric layer.

* * * * *